US006534854B1

(12) United States Patent
Fazelpour et al.

(10) Patent No.: US 6,534,854 B1
(45) Date of Patent: Mar. 18, 2003

(54) PIN GRID ARRAY PACKAGE WITH CONTROLLED IMPEDANCE PINS

(75) Inventors: Siamak Fazelpour, San Diego, CA (US); Hassan S. Hashemi, Laguna Niguel, CA (US); Roberto Coccioli, Thousand Oaks, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 10/005,564

(22) Filed: Nov. 8, 2001

(51) Int. Cl.[7] .............................................. H01L 23/48
(52) U.S. Cl. ....................... 257/697; 257/691; 257/203; 257/207; 257/208; 257/211; 257/531; 257/703; 257/700; 257/701; 257/773
(58) Field of Search ................................ 257/697, 691, 257/203, 207, 208, 211, 531, 703, 700, 701, 773

(56) References Cited

U.S. PATENT DOCUMENTS 5,102,352 A * 4/1992 Arisaka ........................ 439/47
5,527,189 A * 6/1996 Middlehurst et al. ........ 439/608
5,590,030 A * 12/1996 Kametani et al. ........... 174/252
5,714,801 A * 2/1998 Yano et al. .................. 257/691

* cited by examiner

Primary Examiner—Nathan J. Flynn
Assistant Examiner—Pershelle Greene
(74) Attorney, Agent, or Firm—Farjami & Farjami LLP

(57) ABSTRACT

A pin grid array package comprises a number of signal pins and ground pins. At least one of the signal pins is a controlled impedance signal pin, i.e. a signal pin whose impedance is adjusted and/or reduced according to the present invention. The pin grid array package also includes a number of ground planes and signal planes. A controlled impedance signal pin is coupled to one of the signal planes by means of a signal via. A number of ground pins surround the controlled impedance signal pin. By varying the arrangement, number, and separation distance between the ground pins and the controlled impedance signal pin, the impedance of the signal pin is adjusted and/or reduced. Depending on the particular circuit or logic function assigned to a signal pin and its adjacent signal pin, a different degree of impedance control and/or reduction can be achieved by the present invention.

31 Claims, 3 Drawing Sheets

PIN GRID ARRAY PACKAGE WITH CONTROLLED IMPEDANCE PINS

BACKGROUND OF THE INVENTION

1. Field of the Invention

The present invention is generally in the field of semiconductor packaging. More specifically, the present invention is in the field of semiconductor packaging using pin grid array packages.

2. Background Art

The semiconductor fabrication industry is continually faced with a demand for dies which must run at increasingly high frequencies. For example, recent RF ("Radio Frequency") semiconductor devices, which constitute a significant category of semiconductor devices, are required to run at very high frequencies. The requirement of faster devices has resulted in new challenges not only in the fabrication of the die itself, but also in the manufacturing of various packages that are used to provide electrical connection to "off-chip" devices. As an example, the demand for higher frequencies means, among other things, that "on-chip" and "off-chip" parasitics must be minimized.

Pin grid array ("PGA") packaging has traditionally been one of the most reliable, low cost, and well known packaging technologies in the integrated circuit ("IC") industry and has been used in many microprocessor applications. In PGA technology, the connection between the ceramic substrate and the motherboard is achieved by an array of metal pins. The pins are typically about 2.5 to 3.0 mm in length and might be brazed to a ceramic substrate, e.g. $Al_2O_3$. In recent years, however, the PGA technology has gone out of favor for high-speed applications, for example in some high frequency RF applications and in Gigabyte/second (Gb/s) data transmission applications, largely due to the relatively high, and difficult to control, impedance of the pins.

As a result of the high, and difficult to control, impedance of PGA pins, PGA technology has been replaced, in high frequency applications, by technologies such as ball grid array (BGA) or column grid array (CGA), both of which also typically use ceramic substrates. BGA technology utilizes an array of solder balls, each approximately 0.5 to 0.6 mm in length, to provide electrical connections. Column grid array (CGA) technology utilizes columns that are similar to, but shorter than, the pins used in PGA technology. The columns used in CGA are approximately 1.75 to 2.0 mm in length and are soldered with two types of solder to prevent physical collapse during the reflow process.

PGA technology, however, offers distinct advantages since the pins in a PGA are able to handle the strain caused by the typically large mismatch in thermal expansion that exists between ceramic substrate materials and organic motherboard materials, for example. A typical ceramic substrate may have a coefficient of thermal expansion ("CTE") of about 7 ppm/°C., while the laminate material of the motherboard may have a CTE of about 50 ppm/°C., where ppm/°C. is the parts per million expansion per degree Celsius. Therefore, when the temperature rises, the organic motherboard will expand much faster than the ceramic material, resulting in stress and strains that can potentially cause connection joints to fail. The pins in a PGA package, however, are long enough such that they can handle the strain caused by the CTE mismatch, and can thereby improve the reliability and lifetime of such devices.

Therefore, there exists a need for a novel PGA package which is also suitable for high speed RF or high speed data transmission applications.

SUMMARY OF THE INVENTION

The present invention is directed to a pin grid array ("PGA") package with controlled impedance pins. The invention overcomes the need in the art for a novel PGA package which is also suitable for high speed RF or high speed data transmission applications.

According to an embodiment of the invention, a pin grid array package comprises a number of signal pins and ground pins. At least one of the signal pins is a controlled impedance signal pin, i.e. a signal pin whose impedance is adjusted and/or reduced according to the present invention. The pin grid array package also includes a number of ground planes and signal planes.

In one embodiment of the invention, a controlled impedance signal pin is coupled to one of the signal planes by means of a signal via. A number of ground pins surround the controlled impedance signal pin. Each of the ground pins is connected to at least one of the ground planes through respective ground vias. By varying the arrangement, number, and separation distance between the ground pins and the controlled impedance signal pin, the impedance of the signal pin is adjusted and/or reduced.

In one embodiment of the invention, a standard 50 ohm impedance is achieved for the controlled impedance signal pin. In other embodiments of the invention, reference planes, such as power planes, are used instead of ground planes. In that embodiment, a number of reference pins surround the controlled impedance signal pin. Each of the reference pins is connected to at least one of the reference planes through respective reference vias. Depending on the particular circuit or logic function assigned to a signal pin and its adjacent signal pin, a different degree of impedance control and/or reduction can be achieved by the present invention. Various other features and advantages of the present invention are described in the detailed description section below.

DETAILED DESCRIPTION OF THE INVENTION

The present invention is directed to a pin grid array package with controlled impedance pins. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
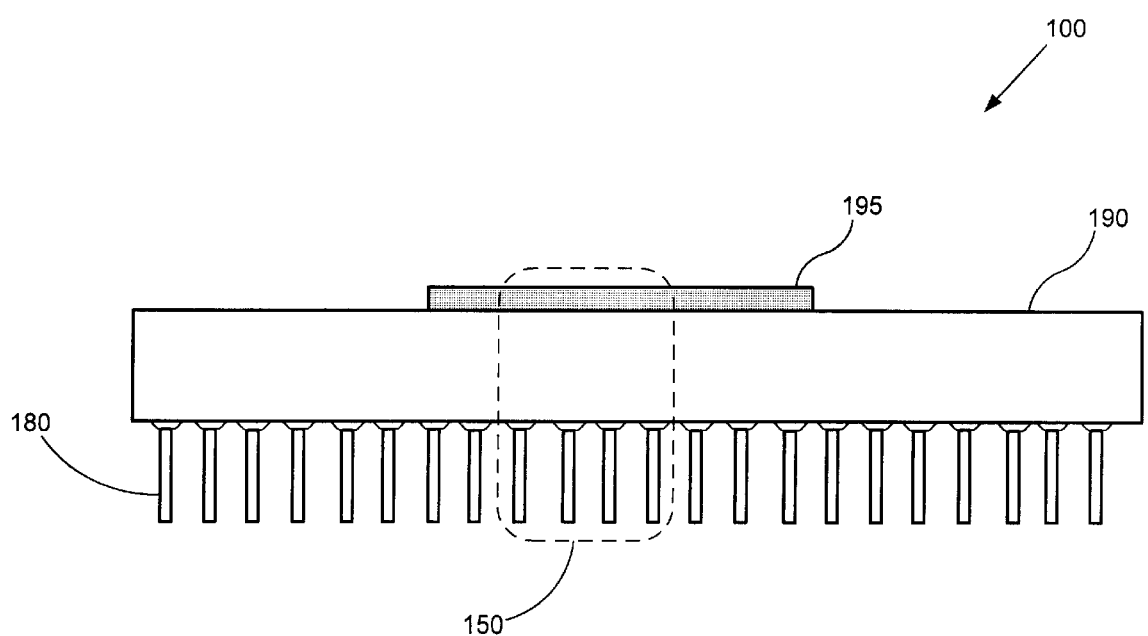
FIG. 1 illustrates an exemplary pin grid array ("PGA") package.

FIG. 1 shows a side view of an exemplary PGA package 100. PGA package 100 comprises die 195, ceramic substrate 190, and pin grid array 180. Die 195 may be electrically connected to interconnect traces on ceramic substrate 190 in a manner known in the art (but not shown in FIG. 1); for example, by bond wires or by a solder bump array under die 195. In the exemplary embodiment of FIG. 1, ceramic substrate 190 might comprise, for example, an $Al_2O_3$ ceramic, and the pins in pin grid array 180 might comprise, for example, a metallic alloy with a high lead content. The pins in pin grid array 180 are typically 2.5 to 3.0 mm in length and might be brazed to ceramic substrate 190 in a manner known in the art. Pin grid array 180 may include pins that have a variety of functions, including signal pins, ground pins, and power pins, for example. Region 150 of FIG. 1 will be shown in an expanded, cross-sectional view in FIG. 2.

Figure 2:
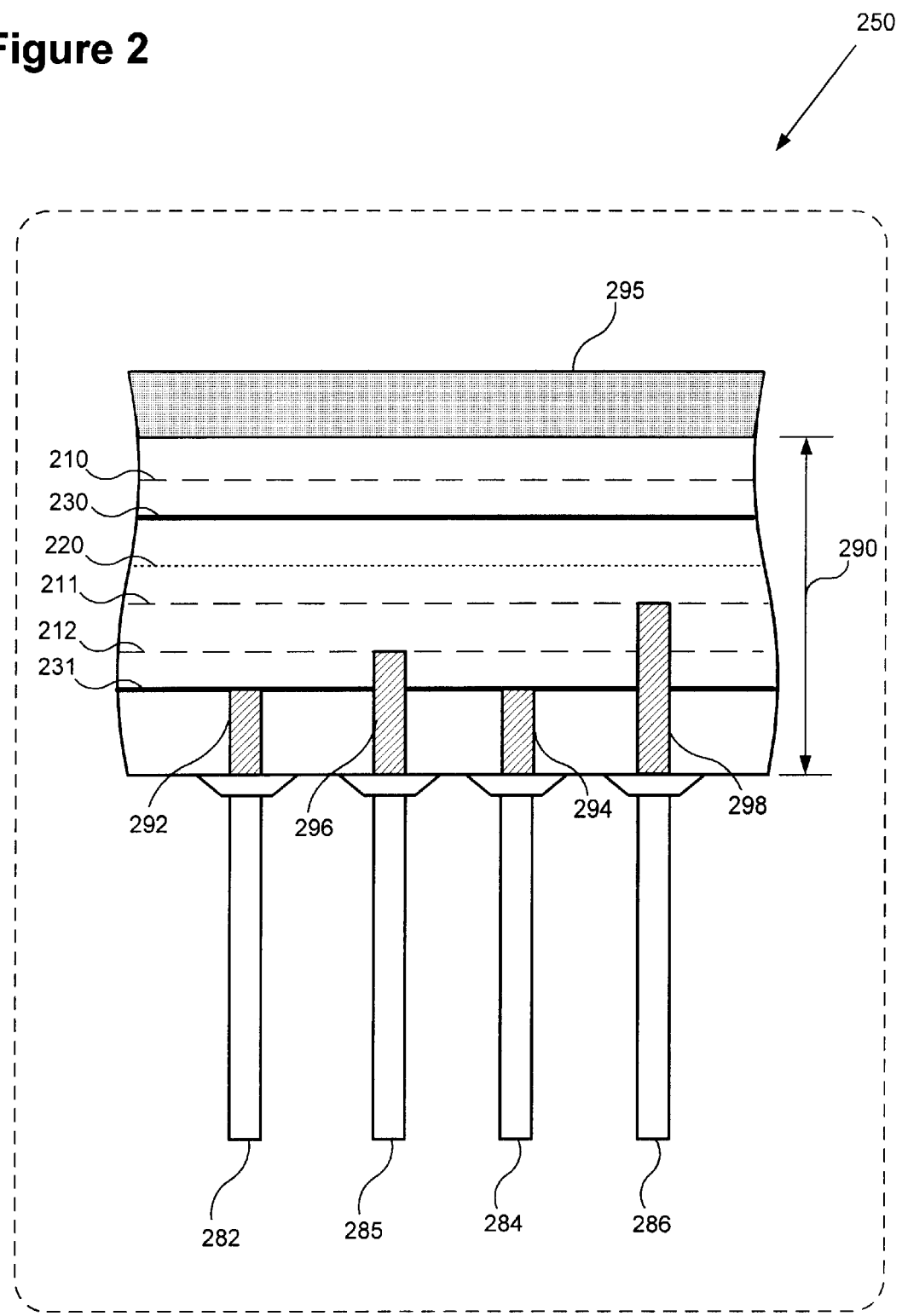
FIG. 2 illustrates an expanded cross-sectional view of an exemplary PGA package according to an embodiment of the present invention.

Referring to FIG. 2, expanded view 250 corresponds to an expanded, cross-sectional view of area 150 in PGA package 100 of FIG. 1. Ceramic substrate 290 corresponds to ceramic substrate 190 of FIG. 1, and die 295 corresponds to die 195 of FIG. 1. Die 295 is shown above ceramic substrate 290 for the purpose of general discussion; however, the details of how die 295 is attached to ceramic substrate 290 are not shown in order not to obscure the concepts of the present invention.

Referring to FIG. 2, expanded view 250 contains four exemplary pins of the exemplary PGA package, i.e. signal pin 285, signal pin 286, ground pin 282, and ground pin 284. The PGA signal pins, such as signal pins 285 and 286, exhibit transmission line properties and may be considered as "transmission lines." Signal pins, such as signal pins 285 and 286, whose impedance is to be controlled by taking into account their transmission line properties, are also referred to as "controlled impedance signal pins" in the present application. In the present example, signal pin 286 is the signal pin closest to signal pin 285. Signal pin 285 is connected to signal plane 212 through signal via 296, and signal pin 286 is connected to signal plane 211 through signal via 298. Ground pins 282 and 284 are connected to ground plane 231 through ground vias 292 and 294, respectively. In the present example, ceramic substrate 290 contains two ground planes, i.e. ground plane 230 and ground plane 231, and one power plane 220. Further, in the present example, ceramic substrate 290 also includes three signal planes, which are signal planes 210, 211, and 212. It is noted that power plane 220 is also referred to as a reference plane in the present application and a via that might be used to connect power plane (or reference plane) 220 to a reference pin is referred to as a reference via in the present application. It is also noted that in other embodiments of the present invention, fewer or greater number of ground planes, signal planes, or reference planes than those shown in FIG. 2 might be utilized.

As mentioned previously, at high signal frequencies, the relatively large length of the pins in a PGA results in a large, and difficult to control, impedance that causes, for example, an increase in noise and a decrease in speed in interfacing with external connections. However, according to the present invention, the impedance of the signal pins in the PGA are generally controlled for impedance matching purposes and, moreover, the impedance of the signal pins in the PGA are reduced to lower the noise and increase the speed of the otherwise high impedance PGA signal pins.

Figure 3A:
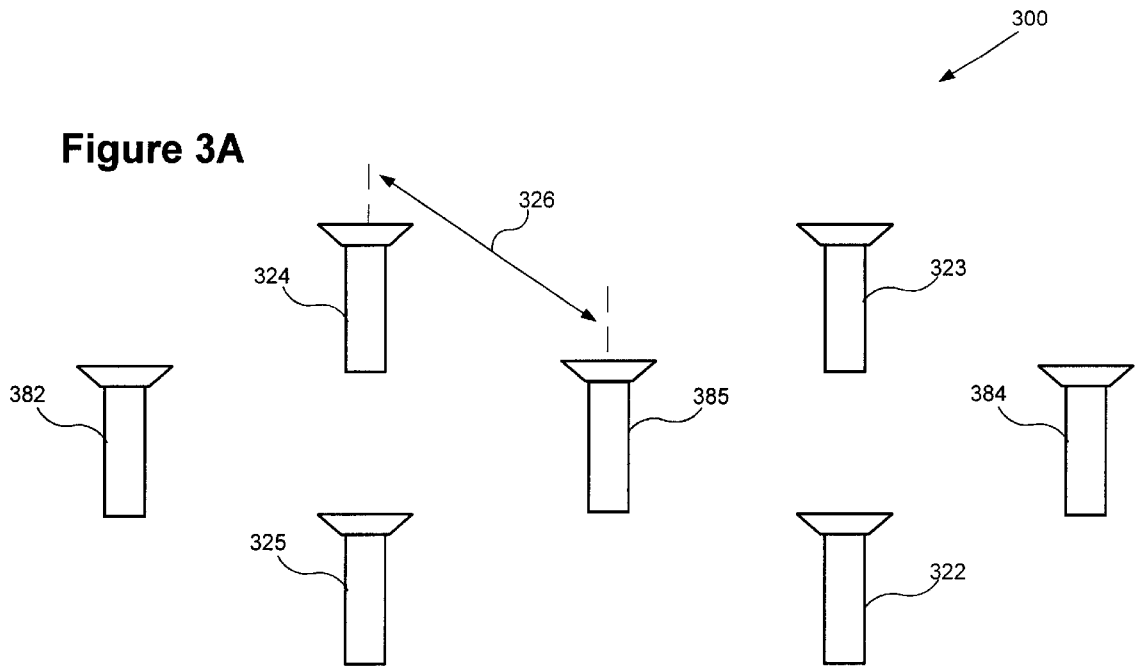
FIG. 3A illustrates a perspective view of an exemplary pin configuration in an exemplary PGA package according to an embodiment of the present invention.

For the purpose of illustrating the exemplary embodiment of the invention, reference is made to pin configuration 300 in FIG. 3A in which signal pin 385 corresponds to signal pin 285 in FIG. 2. Pin configuration 300 in FIG. 3A shows the spatial arrangement of signal pin 385 relative to ground pins surrounding signal pin 385. By way of the exemplary embodiment of the invention shown in FIGS. 2 and 3A, the impedance of signal pin 385 is to be controlled and/or reduced in accordance with an embodiment of the present invention.

As shown in pin configuration 300, signal pin 385 is surrounded by ground pins 382, 324, 325, 323, 322, and 384. Ground pins 382 and 384 correspond, respectively, to ground pins 282 and 284 in FIG. 2. It is noted that ground pins 324, 325, 323, and 322 are at a different "depth" relative to ground pin 382, signal pin 385, and ground pin 384. As such, ground pins 324, 325, 323, and 322, are not shown, and cannot be shown, in the cross-sectional view of FIG. 2 which shows only ground pins 382 and 384 (i.e. ground pins 282 and 284) which are at the same "depth" as signal pin 385 (i.e. signal pin 285). Thus, in the exemplary embodiment of the invention shown in pin configuration 300 of FIG. 3A, a number of ground pins surround signal pin 385, where most of those ground pins are not apparent in the cross-sectional view of FIG. 2.

Figure 3B:
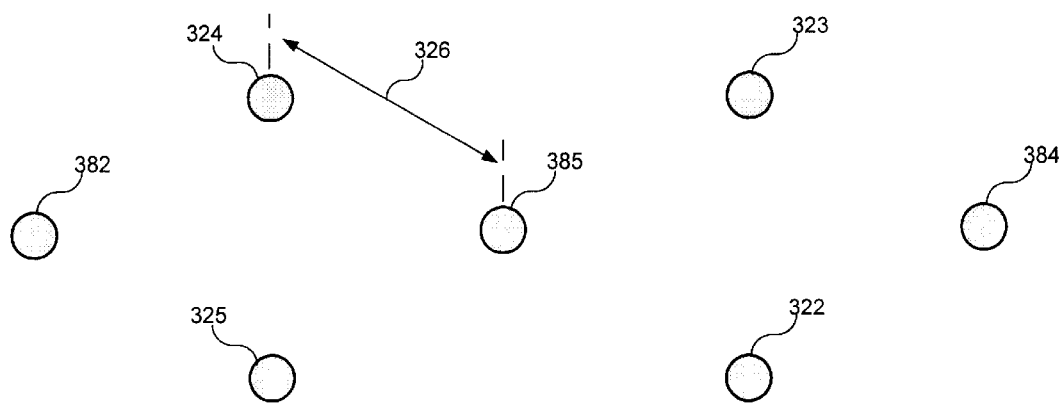
FIG. 3B illustrates a bottom view of the exemplary pin configuration shown in FIG. 3A.

Reference is now made to FIG. 3B which shows a bottom view of pin configuration 300 in FIG. 3A. As in FIG. 3A, FIG. 3B shows the spatial arrangement of signal pin 385, corresponding to signal pin 285 in FIG. 2, relative to ground pins surrounding signal pin 385. As shown in FIG. 3B, signal pin 385 is surrounded by ground pins 382, 324, 325, 323, 322, and 384. Ground pins 382 and 384 correspond, respectively, to ground pins 282 and 284 in FIG. 2. FIG. 3B aids in further illustrating that ground pins 324, 325, 323, and 322 are at a different "depth" relative to ground pin 382, signal pin 385, and ground pin 384. As such, ground pins 324, 325, 323, and 322, are not shown in the cross-sectional view of FIG. 2 which shows only ground pins 382 and 384 (i.e. ground pins 282 and 284) which are at the same "depth" as signal pin 385 (i.e. signal pin 285).

With reference to FIGS. 2, 3A and 3B, it is noted that the impedance of a signal pin, such as signal pin 385, is determined in part by a "return path" which is determined by the number, arrangement, and distance of any ground pins, or in general any reference pins with a constant DC voltage (and no AC component), around signal pin 385. It is known that in response to a current flow through a conductor, such as signal pin 385, an "imaginary current" flows through an "imaginary conductor" situated at an opposite side of a ground pin, or in general a reference pin with a constant DC voltage (and no AC component), next to signal pin 385. The imaginary current loop that results from the existence of the "imaginary current" in the "imaginary conductor" and the existence of the "real current" in signal pin 385, affects the impedance of signal pin 385. As such, the impedance of signal pin 385 is determined, in part, by the arrangement, number, and the distance of any ground pins or reference pins around signal pin 385.

According to an embodiment of the present invention, illustrated in FIGS. 2, 3A, and 3B, the impedance of a signal pin is controlled and/or reduced by the number, distance, and arrangement of various ground pins surrounding the signal pin, such as signal pin 385. It is noted that the distance between the pins in a semiconductor package, such as a PGA package, is also referred to as a "pitch." For example, distance 326 in pin configuration 300 in FIG. 3A is referred to as a pitch. Generally, the pitch in a semiconductor package, such as a PGA package, remains uniform. In other words, any two given pins in a PGA package would have a distance from one another which is equal to the distance between any other two pins in the PGA package. However, the present invention is applicable to a PGA package regardless of whether or not the PGA package preserves a uniform pitch. Distance 326 (or pitch 326) is also referred to as a separation distance in the present application.

Referring back to FIG. 2, it is shown that according to the present invention a signal pin, such as signal pin 285 corresponding to signal pin 385 in FIGS. 3A and 3B, can be part of a desired pin configuration of ground or reference pins surrounding the signal pin. As seen in FIG. 2, signal pin 285 is connected to signal plane 212 through signal via 296. Ground pins 282 and 284 are connected to ground plane 231 through ground vias 292 and 294, respectively. Alternatively, ground pins 282 and 284 could have been connected to ground plane 230. In one embodiment, pins 282 and 284 are "reference pins" and not ground pins. For example, connecting pins 282 and 284 to a constant DC voltage (with no AC component) results in reference pins 282 and 284 which can be used to control and/or reduce the impedance of signal pin 285. As stated above, other ground pins or reference pins which are at a depth different from ground pins 282 and 284 are not shown in FIG. 2. However, other ground pins or reference pins can also access ground planes 231 and 230 and power plane 220 in the manner stated above.

In the manner described above, the impedance of a signal pin can be controlled and/or reduced. In other words, the impedance of a signal pin, such as signal pin 285 can be controlled by controlling the length of the imaginary current loop discussed above. A reduction of the length of the imaginary current loop results in a reduction of the impedance of the signal pin while an increase in the length of the imaginary current loop results in an increase of the impedance of the signal pin. Thus, if a standard impedance of 50 ohms is desired, by increasing or decreasing the length of the imaginary current loop, i.e. by adjusting the distance, arrangement, and number of ground or reference pins around a signal pin, the desired standard impedance of 50 ohms can be achieved. On the other hand, if it is desired to simply reduce the impedance of a signal pin as much as possible, a pin configuration would be designed such that the number of ground or reference pins around the particular signal pin is maximized and that the signal pin is surrounded only by ground or reference pins.

It should be noted that all of the signal pins in a PGA package, such as PGA package 100 in FIG. 1, do not necessarily need to be controlled impedance pins. Based on the circuit or logic function of a particular signal pin, the extent of impedance control, if any, for that particular signal pin can be determined. It is manifest that as the number of pins allocated as ground or reference pins increases, fewer pins remain available to function as signal pins. According to the invention, the circuit or logic functions of various signal pins and their inter-relation with other signal pins is used to optimally control and/or reduce the impedance of each signal pin. In other words, depending on the particular signal pin, it may or may not be required or desirable to provide a great number of ground or reference pins in proximity of that particular signal pin.

As an example, suppose that a particular signal pin, such as signal pin 285 in FIG. 2, is to operate at a different frequency relative to another signal pin, such as signal pin 286 in FIG. 2. The frequencies of operation of the two signal pins might be very different; for example, signal pin 285 could be operating at approximately 32 MHz while signal pin 286 could be operating at approximately 620 MHz. In that case, it may be desirable to reduce the impedance of signal pin 286 more than that of signal pin 285. In other words, since in this example signal pin 286 carries higher frequencies, additional ground pins or reference pins should be situated in close proximity of signal pin 286 to ensure that its impedance is significantly reduced.

Moreover, if there is a particular signal pin which requires little or no impedance control, that particular signal pin does not need to be located adjacent to ground pins or reference pins, thus freeing up other pins in the PGA package for use as ground or reference pins for other signal pins whose impedance control and/or reduction is more important.

In the manner described above, impedance control and/or impedance reduction of a signal pin can allow it to handle high frequency applications. As previously mentioned, high frequency applications usually require higher pin counts which in turn lead to larger and larger packages. The increase in package size intensifies problems such as impedance mismatches between two interconnect structures. Moreover, the high impedance of the relatively long pins used in high-speed PGA applications has adverse effects on the performance of the PGA package. The lack of control over impedance of PGA pins can be considerably reduced or eliminated by making the PGA signal pins "controlled impedance structures" in the manner described above. The improvement resulting from the present invention can allow for the use of the PGA technology in high speed applications, without the performance limitations of previous PGA packages.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a pin grid array package with controlled impedance pins has been described.

What is claimed is:

1. A pin grid array package comprising:
   a plurality of signal pins, including a controlled impedance signal pin, said controlled impedance signal pin having an individually controlled impedance;
   a plurality of ground planes within said pin grid array package;
   a plurality of signal planes within said pin grid array package;
   said controlled impedance signal pin being coupled to one of said plurality of signal planes by a signal via;
   a plurality of ground pins immediately adjacent to said controlled impedance signal pin, each of said plurality of ground pins contacting at least one of said plurality of ground planes.

2. The pin grid array package of claim 1 further comprising:

a plurality of reference planes within said pin grid array package;

a plurality of reference pins immediately adjacent to said controlled impedance signal pin, each of said plurality of reference pins contacting at least one of said plurality of reference planes.

3. The pin grid array package of claim 2 wherein at least one of said plurality of reference planes is a power plane.

4. The pin grid array package of claim 1 wherein said impedance of said controlled impedance signal pin is controlled by said plurality of ground pins.

5. The pin grid array package of claim 1 wherein an impedance of said controlled impedance signal pin is reduced by said plurality of ground pins.

6. The pin grid array of claim 4 wherein said impedance of said controlled impedance signal pin is controlled by adjusting a separation distance between said controlled impedance signal pin and at least one of said plurality of ground pins.

7. The pin grid array of claim 6 wherein said impedance of said controlled impedance signal pin is approximately 50 ohms.

8. The pin grid array of claim 5 wherein said impedance of said controlled impedance signal pin is reduced by reducing a separation distance between said controlled impedance signal pin and at least one of said plurality of ground pins.

9. The pin grid array package of claim 2 wherein an impedance of said controlled impedance signal pin is controlled by said plurality of reference pins.

10. The pin grid array package of claim 2 wherein an impedance of said controlled impedance signal pin is reduced by said plurality of reference pins.

11. The pin grid array of claim 9 wherein said impedance of said controlled impedance signal pin is controlled by adjusting a separation distance between said controlled impedance signal pin and at least one of said plurality of reference pins.

12. The pin grid array of claim 11 wherein said impedance of said controlled impedance signal pin is approximately 50 ohms.

13. The pin grid array of claim 10 wherein said impedance of said controlled impedance signal pin is reduced by reducing a separation distance between said controlled impedance signal pin and at least one of said plurality of reference pins.

14. A pin configuration in a semiconductor package, said pin configuration comprising:

a plurality of ground pins surrounding a controlled impedance signal pin;

said controlled impedance signal pin being coupled to a signal plane in said semiconductor package;

said plurality of ground pins being coupled to at least one ground plane in said semiconductor package;

said pin configuration causing an impedance of said controlled impedance signal pin to be adjusted in response to adjusting a distance of at least one of said plurality of ground pins relative to said controlled impedance signal pin.

15. The pin configuration of claim 14 wherein said controlled impedance signal pin is coupled to said signal plane through at least one signal via.

16. The pin configuration of claim 14 wherein said plurality of ground pins are coupled to said at least one ground plane through at least one ground via.

17. The pin configuration of claim 14 wherein said pin configuration causes said impedance of said controlled impedance signal pin to be reduced in response to reducing said distance of said at least one of said plurality of ground pins relative to said controlled impedance signal pin.

18. The pin configuration of claim 14 wherein said pin configuration causes said impedance of said controlled impedance signal pin to be approximately 50 ohms.

19. The pin configuration of claim 14 further comprising a plurality of reference pins surrounding said controlled impedance signal pin.

20. The pin configuration of claim 19 wherein said plurality of reference pins are coupled to at least one reference plane in said semiconductor package.

21. The pin configuration of claim 20 wherein said plurality of reference pins are coupled to said at least one reference plane through at least one reference via.

22. A pin grid array package comprising:

a plurality of signal pins, including a controlled impedance signal pin;

a plurality of ground planes within said pin grid array package;

a plurality of signal planes within said pin grid array package;

said controlled impedance signal pin being coupled to one of said plurality of signal planes by a signal via;

a plurality of ground pins immediately adjacent to said controlled impedance signal pin, each of said plurality of ground pins contacting at least one of said plurality of ground planes;

wherein an impedance of said controlled impedance signal pin is controlled by said plurality of ground pins.

23. The pin grid array package of claim 22 wherein said impedance of said controlled impedance signal pin is controlled by said plurality of ground pins such that said plurality of ground pins reduces said impedance of said controlled impedance signal pin.

24. The pin grid array package of claim 22 wherein said impedance of said controlled impedance signal pin is controlled by adjusting a separation distance between said controlled impedance signal pin and at least one of said plurality of ground pins.

25. The pin grid array package of claim 24 wherein said impedance of said controlled impedance signal pin is approximately 50 ohms.

26. The pin grid array package of claim 23 wherein said impedance of said controlled impedance signal pin is reduced by reducing a separation distance between said controlled impedance signal pin and at least one of said plurality of ground pins.

27. A pin grid array package comprising:

a plurality of signal pins, including a controlled impedance signal pin;

a plurality of ground planes within said pin grid array package;

a plurality of signal planes within said pin grid array package;

said controlled impedance signal pin being coupled to one of said plurality of signal planes by a signal via;

a plurality of ground pins immediately adjacent to said controlled impedance signal pin, each of said plurality of ground pins contacting at least one of said plurality of ground planes;

a plurality of reference planes within said pin grid array package;

a plurality of reference pins immediately adjacent to said controlled impedance signal pin, each of said plurality of reference pins contacting at least one of said plurality of reference planes;

wherein an impedance of said controlled impedance signal pin is controlled by said plurality of reference pins.

28. The pin grid array package of claim 27 wherein said impedance of said controlled impedance signal pin is controlled by said plurality of reference pins such that said plurality of reference pins reduces said impedance of said controlled impedance signal pin.

29. The pin grid array package of claim 27 wherein said impedance of said controlled impedance signal pin is controlled by adjusting a separation distance between said controlled impedance signal pin and at least one of said plurality of reference pins.

30. The pin grid array package of claim 29 wherein said impedance of said controlled impedance signal pin is approximately 50 ohms.

31. The pin grid array package of claim 28 wherein said impedance of said controlled impedance signal pin is reduced by reducing a separation distance between said controlled impedance signal pin and at least one of said plurality of reference pins.

* * * * *